(12) United States Patent
Ikegami

(10) Patent No.: US 7,084,069 B2
(45) Date of Patent: Aug. 1, 2006

(54) METHOD FOR MANUFACTURING A SEMICONDUCTOR DEVICE

(75) Inventor: Naokatsu Ikegami, Saitama (JP)

(73) Assignee: Oki Electric Industry Co., Ltd., Tokyo (JP)

(*) Notice: Subject to any disclaimer, the term of this patent is extended or adjusted under 35 U.S.C. 154(b) by 285 days.

(21) Appl. No.: 09/996,788

(22) Filed: Nov. 30, 2001

(65) Prior Publication Data

US 2003/0040190 A1  Feb. 27, 2003

(30) Foreign Application Priority Data

Aug. 21, 2001  (JP)  ............... 2001-249905

(51) Int. Cl.
*H01L 21/302*  (2006.01)

(52) U.S. Cl. .................... 438/714; 438/723
(58) Field of Classification Search ........ 438/706, 438/707, 710, 712, 714, 723
See application file for complete search history.

(56) References Cited

U.S. PATENT DOCUMENTS

| | | | | |
|---|---|---|---|---|
| 5,356,515 A | * | 10/1994 | Tahara et al. ............... | 438/715 |
| 5,827,778 A | * | 10/1998 | Yamada ....................... | 438/637 |
| 5,843,847 A | * | 12/1998 | Pu et al. ...................... | 438/723 |
| 6,174,796 B1 | * | 1/2001 | Takagi et al. ................ | 438/622 |
| 6,251,792 B1 | * | 6/2001 | Collins et al. .............. | 438/710 |
| 6,458,516 B1 | * | 10/2002 | Ye et al. ....................... | 430/317 |
| 6,589,879 B1 | * | 7/2003 | Williams et al. ............ | 438/714 |

FOREIGN PATENT DOCUMENTS

JP  11-233632  8/1999

* cited by examiner

*Primary Examiner*—Kin-Chan Chen
(74) *Attorney, Agent, or Firm*—VolentineFrancos&Whitt PLLC

(57) ABSTRACT

Abstract of the Disclosure A method for manufacturing a semiconductor device including a conductive path extending from the upper surface of an insulating layer on a semiconductor substrate to a conductive member embedded in the insulating layer. An etching mask, which defines an etched hole for the conductor path, is formed on the insulating layer within a specified permissible error, and that portion of the insulating layer which is not covered by the etching mask is removed by a reactive ion etching unit having a reaction chamber into which a reactive gas of $CHF_3/CO$ is introduced at a $CHF_3/CO$ flow ratio of about 15/85. After this, the etched hole formed by an etching process is filled with a conductive material for the conductive path.

18 Claims, 5 Drawing Sheets

GRAPH(1) SHOWING ETCHING CHARACTERISTICS
WHEN PRESSURE OF REACTION CHAMBER WAS VARIED

GRAPH(2) SHOWING ETCHING CHARACTERISTICS WHEN FLOW RATES OF MIXED GAS WAS VARIED

METHOD FOR MANUFACTURING A SEMICONDUCTOR DEVICE

FIELD OF THE INVENTION

The present invention relates to a method for manufacturing a semiconductor device, and particularly to a method for manufacturing a semiconductor device including a step of forming a conductive path extending from an insulating layer on a semiconductor substrate to a conductive member embedded in the insulating layer.

RELATED ART

To form a conductive path extending from an insulating layer on a semiconductor substrate to a conductive member embedded in the insulating layer, JP-A-11-233632 discloses a method by which to form a through-hole in the insulating layer which leads to the conductive member, and then fill the through-hole with a conductive material.

In the method disclosed in the above publication, when the through-hole is displaced from where it is aligned with the conductive member, if, by this misalignment, the unaligned recess portion of the through-hole, which extends downwardly from the conductive member, reaches a lower conductive member located beneath or any conductive part on the substrate, a short-circuit problem arises. As a measure to prevent this short-circuit, to stuff up the unaligned recess portion with an insulating material, a new insulating film is deposited on the whole of the insulating layer, including the internal wall of the through-hole. After this new insulating layer has been deposited, the unnecessary portion of the deposited insulating layer is removed by etching, and then the through-hole, whose unaligned recess portion has been stuffed up, is filled with a conductive member, by which the conductive path leading to the conductive member is formed without causing a problem such as a short-circuit of the conductive path caused by misalignment.

However, according to the prior art mentioned above, as described above, it is necessary to perform a step of stuffing with a new insulating material the unaligned recess portion extending downwardly from the conductive member caused by misalignment of the through-hole and an etching step to remove the unnecessary portion of the deposited insulating layer, and by these steps, the manufacturing process of a semiconductor device is complicated, and it is not easy to appropriately control the thickness of the deposited insulating material used to stuff the unaligned recess portion.

Because the unaligned recess portion of the through-hole is stuffed with an insulating material, the effective bore diameter of the through-hole is reduced if a filling material is deposited with an immoderate thickness, and the electrical resistance of the conductive path used to fill the through-hole is increased.

Therefore, the object of the present invention is to provide a method for manufacturing a semiconductor device including a conductive path by which to fill the through-hole, and a method for manufacturing a semiconductor device relatively easily which can prevent an increase in the electrical resistance of the conductive path that fills up the through-hole without making the manufacturing process more complicated or causing the short-circuit problem resulting from misalignment of the through-hole.

SUMMARY OF THE INVENTION

The inventor of the present invention makes a finding that when a reactive ion etching unit is used to form an etched hole for a conductive path extending from the insulating layer of silicon dioxide on a semiconductor substrate to the conductive member embedded in the insulating layer and a mixed reaction gas consisting of $CHF_3/CO$ is supplied to the reaction chamber by feeding the respective component gases at specified flow rates, etching takes place but comes to a stop without progressing to such an extend as causing the short-circuit problem as in the past so long as misalignment of an etching mask is within a permissible error.

The present invention utilizes this etching stop phenomenon. According to an aspect of the present invention, there is provided a method for manufacturing a semiconductor device having a conductive path extending from an upper surface of an insulating layer of silicon dioxide on a semiconductor substrate to a conductive member embedded in the insulating layer, comprising the steps of forming on the insulating film an etching mask defining an etched hole for the conductive path within a permissible placement error, performing a selective etching process to the insulating layer to remove a region of the insulating layer not covered by the etching mask by using a reactive ion etching unit for introducing into a reaction chamber reactive gas of $CHF_3/CO$ components, respectively flowing at a flow ratio of about 15/85, and filling the hole formed by the etching process with a conductive material for the conductive path.

It has been clarified that according to the present invention, when the pressure of the reaction chamber of the reactive ion etching unit is not less than 100 mTorr and the high-frequency power of the etching unit is 1600 W, if the placement error, or the misalignment, of the etching mask is not more than 0.04 µm, the etched hole is not formed deeper than 300 nm from the surface of the conductive member.

The etching stop phenomenon that the progress of etching stops before the depth of the conductive member reaches 300 nm means that the etched hole is shallow enough not to reach the lower conductive member located under the conductive member or the semiconductor substrate. In other words, when the flow rates of $CHF_3$ and CO are set at about 30 sccm and about 170 sccm, for example, by placing the etching mask within a permissible placement error of 0.04 µm, it is possible to prevent the etched hole from reaching a region where a problem could arise, such as a short-circuit, caused by misalignment of the etching mask.

Therefore, the unaligned portion of the etched hole due to misalignment of the etching mask need not be stuffed with an insulating material as in the past, and by merely filling the etched hole with a conductive material, the conductive path leading to the conductive member in the insulating layer can be formed without causing a short-circuit.

With an intention of ensuring that the pressure of the reaction chamber of the reactive ion etching unit was not less than 200 mTorr and the flow rate of a reactive gas was not less than about 300 sccm, when the flow rates of $CHF_3$ and CO were set, for example, at about 45 sccm and about 255 sccm, the etching stop phenomenon was witnessed in which the etched hole did not advance deeper than about 100 nm from the surface of the conductive member so long as the placement error of the etching mask was less than 0.1 µm.

Therefore, by setting the pressure of the reaction chamber of the reactive ion etching unit at 200 mTorr or higher and the flow rate of a reactive gas at about 300 sccm or higher, a short-circuit can be prevented more securely and a larger permissible placement error can be assigned to the etching mask.

According to another aspect of the present invention, another method for manufacturing a semiconductor device having a conductive path extending from an upper surface of an insulating layer of silicon dioxide on a semiconductor substrate to a conductive member embedded in the insulating layer, comprising the steps of forming on the upper surface of the insulating layer an etching mask defining an etched hole for the conductive path extending to the conductive member within a permissible placement error, performing a selective etching process to the insulating layer by using a reactive gas to remove a region of the insulating layer not covered by the etching mask, depositing a polymeric product by a polymeric film generating action of the reactive gas into an etched groove resulting from the misalignment of the etching mask, and filling the etched hole formed by the etching process with a conductive material for the conductive path.

As the above-mentioned reactive gas, a mixed gas of $CHF_3$ and CO may be used. The flow rate of the mixed gas is preferably about 300 sccm or higher and the reactive gas pressure in the reaction chamber is preferably 200 mTorr or higher.

DESCRIPTION OF A PREFERRED EMBODIMENT

The present invention will be described in detail with reference to an embodiment illustrated in the accompanying drawings.

FIGS. 1(a)~1(d) show steps of a method for manufacturing a semiconductor device according to the present invention.

Figure 1A:
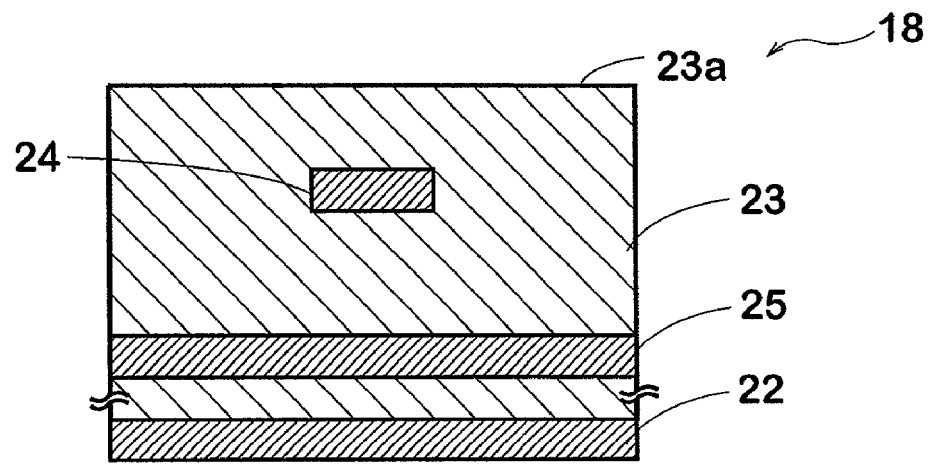
FIGS. 1(a)~1(d) are sectional views schematically showing the steps of a manufacturing method of a semiconductor device according to the present invention.
Figure 1B:
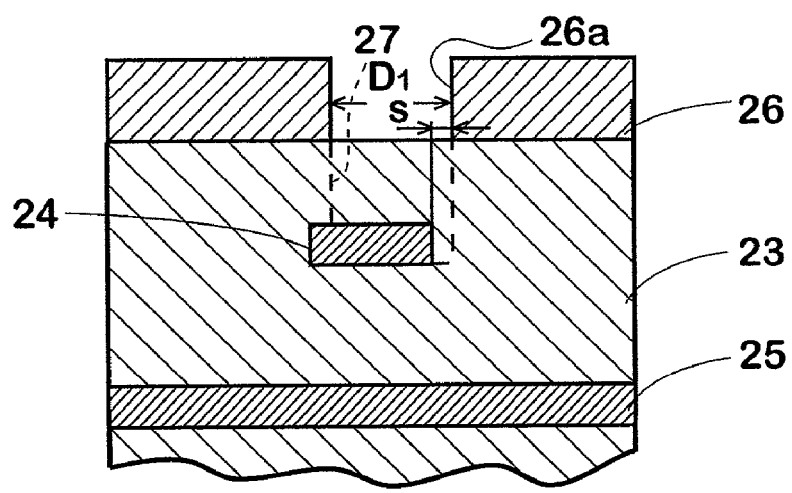
Figure 1C:
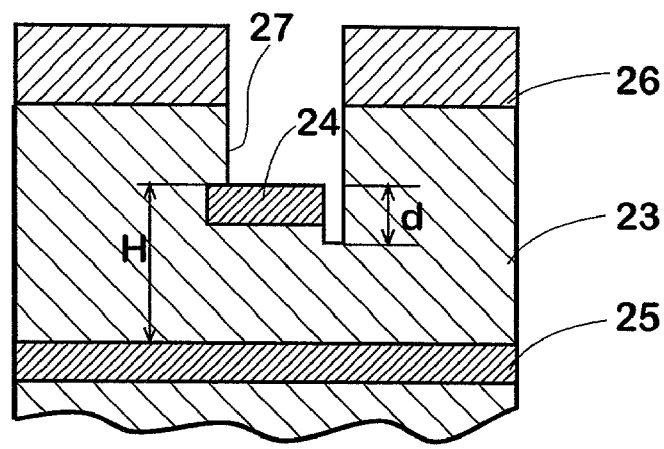
Figure 1D:
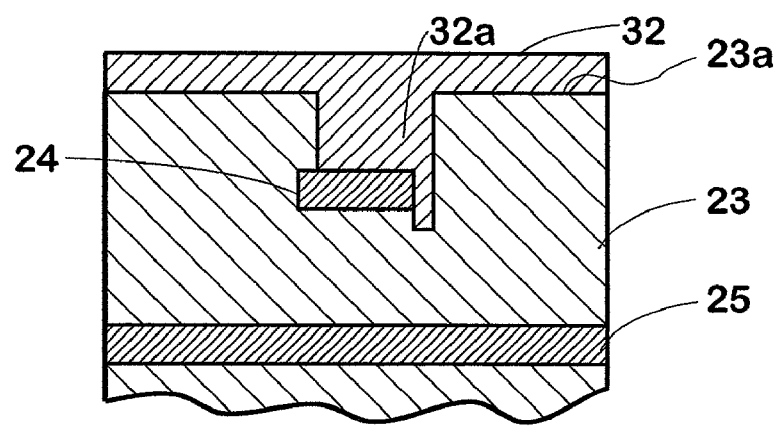
Figure 2:
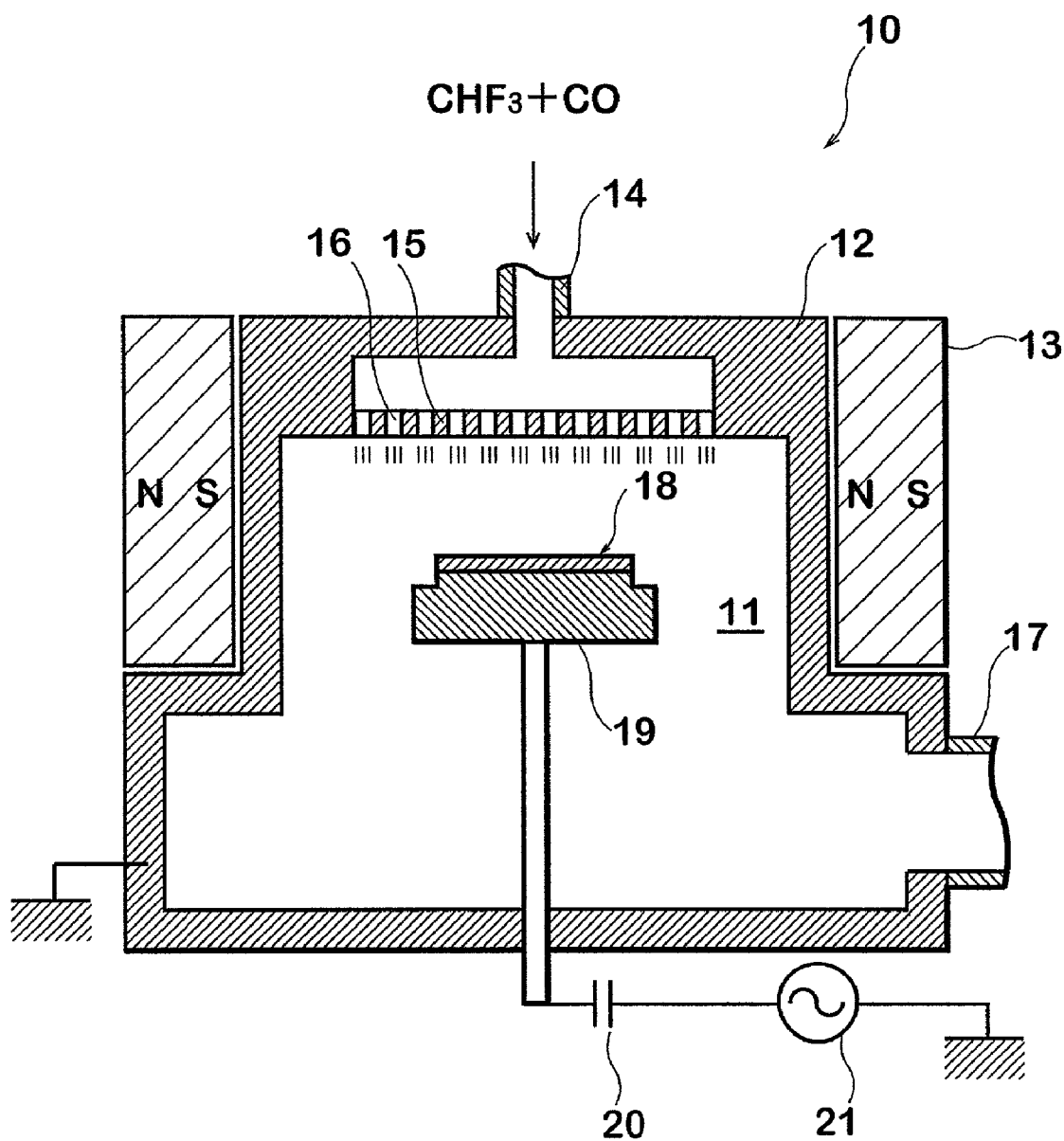
FIG. 2 is a sectional view schematically showing a reactive ion etching unit for carrying out a manufacturing method according to the present invention shown in FIG. 1.

Referring to FIG. 2, description will first be made of an example of a reactive ion etching unit used for carrying out the present invention before moving to the description of a manufacturing method according to the present invention with reference to FIGS. 1(a)~1(d).

A reactive ion etching unit 10 according to the present invention is a dipole ring magnetron reactive ion etching (RIE) unit in the example shown in FIG. 2. As has been well known, the dipole ring magnetron reactive ion etching unit 10 includes a plurality of permanent magnets 13 arranged surrounding a housing 12 which defines the reaction chamber 11.

An etching gas is supplied from a supply port 14 to the reaction chamber 11 through gas blowout holes 16 of an upper electrode 15. The etching gas is discharged from the reaction chamber 11 through an exhaust port 17, formed in the housing 12, which is connected to an exhauster, not shown.

The upper electrode 15 is grounded together with the housing 12 to keep the etching gas supplied to the reaction chamber 11 in plasma state, and to a sample holder 19 serving as the lower electrode on which a processing sample 18 is mounted, as is well known, high-frequency power is supplied from a high-frequency power source 21 through a blocking capacitor 20 to block a DC component of voltage.

The permanent magnets 13, as is well known, are driven to rotate around the housing 12 so that their magnetic forces can increase the plasma density in the reaction chamber 11 to thereby improve the etching effect by etching gas.

According to the etching method according to the present invention, as the etching gas supplied to the reaction chamber 11, a mixed gas of $CHF_3$ and CO is used.

An example of a semiconductor device which is subjected to an etching process by the above-mentioned mixed etching gas is shown in FIGS. 1(a)~(d).

As shown in FIG. 1(a), a semiconductor device 18 arranged as a sample on the sample holder 19 includes a semiconductor substrate 22, such as silicon, and an electrode member 24 made of a metal material, such as aluminum, embedded as a conductive member in an insulating layer 23 made of silicon dioxide formed on the semiconductor substrate.

In the example shown in FIG. 1(a), in the insulating layer 23, a second conductive member 25 is embedded as a lower electrode member below the electrode member 24.

For simplicity of drawing, the semiconductor substrate 22 is omitted in FIGS. 1(b)~1(d).

The reactive ion etching unit 10 is used to form an etched hole for a conductive path extending from the surface 23a of the insulating layer 23 down to the electrode member 24. Before the etching process by the reactive ion etching unit 10, as shown in FIG. 1(b), as is well known, a resist mask 26 made of a photoresist material is formed on the surface 23a by photolithography.

In the resist mask 26, an opening 26a is formed with a diameter D1 of 0.2~0.3 μm, for example, which substantially corresponds to the width of the electrode member 24. The reactive ion etching unit 10 is used to remove a region of the insulating layer 23 exposed through the opening 26a to thereby form an etched hole 27 leading to the electrode member 24. For a selective etching process to form the etched hole 27, the semiconductor device is placed on the sample holder 19 such that the surface 23a of the insulating layer 23 faces the upper electrode 15 of the reactive ion etching unit 10.

In the present invention, as a mixed gas introduced into the reaction chamber 11 from the supply port 14 of the reactive ion etching unit 10, a mixed gas of $CHF_3$ and CO is used as mentioned above.

By using a mixed gas of $CHF_3$ and CO is used as an etching gas, the region of the insulating layer 23 exposed through the opening 26a of the resist mask 26 is selectively removed by etching. Therefore, when the opening 26a of the resist mask 26 is formed at a position where the opening 26a is aligned with the electrode member 24, an offset of the opening 26a with respect to the electrode member 24 as shown in FIG. 1(b) does not occur. Consequently, when the etched hole extends right onto the electrode member 24, the electrode member 24 serves as an etching stopper, so that the etched hole is formed to open in correct alignment with the electrode member 24.

In contrast, if the semiconductor device 18 receives an etching process under the condition that there is an offset caused by misalignment of the resist mask 26, the offset of the etched hole 27 is likely to extend below the electrode member 24 and reach the lower electrode member 25.

The inventor discovered the etching stop condition by which to prevent the etched hole from reaching the lower electrode member 25 even if an offset of the opening 26a is caused by misalignment of the resist mask 26 in the etching process in the reactive ion etching unit 10 where the mixed gas is introduced into the reaction chamber 11.

Because the reaction by an etching gas generally includes an etching action and a polymerizing action, in the above-mentioned etching process, in addition to an etching action, a polymerizing action takes place which deposits a polymeric product on the etched portion. Under the above-mentioned etching stop condition, a polymeric product produced by the polymeric film generating action by the etching gas is deposited in the etched groove (s), which is formed to correspond to an offset caused by misalignment of the resist mask 26, and as the etching action and the polymerizing action are balanced, it appears that the etching stop phenomenon manifests itself.

Figure 3:
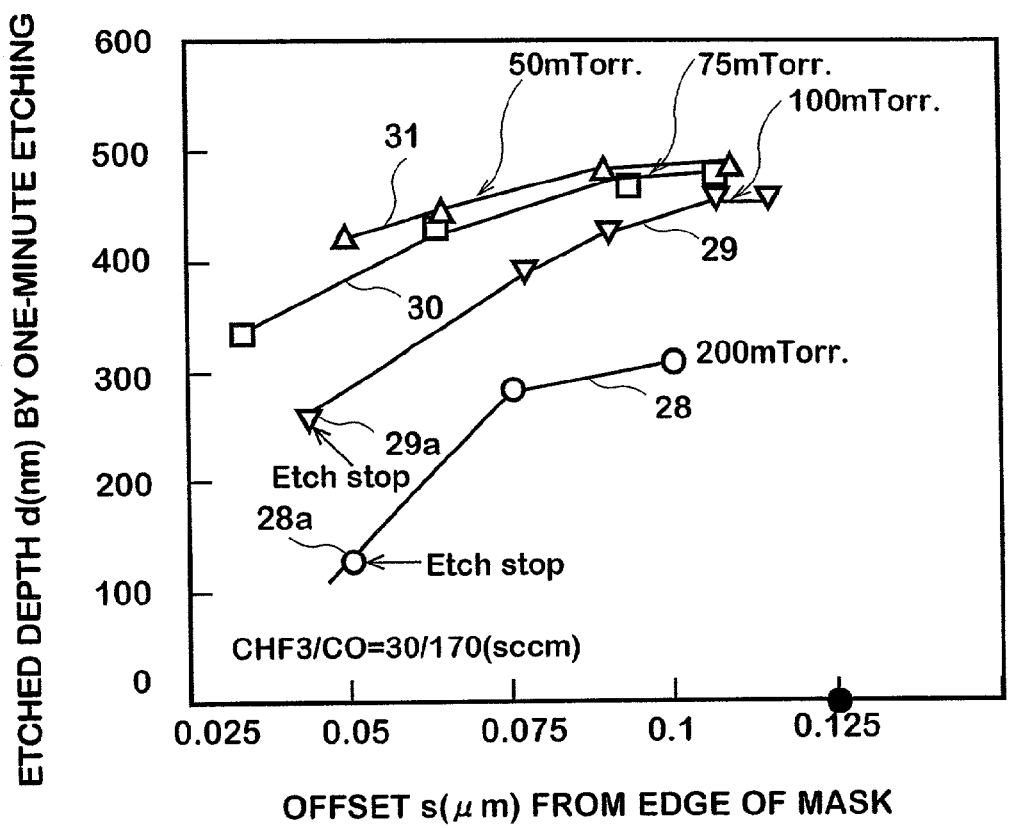
FIG. 3 is a graph (1) showing the etching characteristics of the insulating layer when the reaction chamber pressure was varied by mixed-gas fixed flow rates in the reactive ion etching unit according to the present invention.

FIG. 3 is a graph (1) obtained from results of an experiment to find the etching stop condition, in which the horizontal axis denotes offsets s (in μm) of the resist mask 26 and the vertical axis denotes depths d (in μm) (see FIG. 1(c)) of the unaligned recess portion of the etched hole 27 from the upper surface of the electrode member 24 by etching for one minute.

This experiment was conducted while $CHF_3$ and CO were supplied to the reaction chamber 11 respectively at flow rates of about 30 sccm and about 170 sccm so that the flow ratio of $CHF_3$ and CO was about 15/85 and output of the high-frequency power source 21 was maintained at 1600 W. The relation between the depth d and the offset of the resist mask 26 was obtained after the etching process was carried out for one minute with the pressure of the reaction chamber 11 varied as a parameter.

In the graph (1) of FIG. 3, the characteristic curves 28, 29, 30 and 31 show relations between the depth d and the offset at reaction chamber pressures of 200 mTorr, 100 mTorr, 75 mTorr and 50 mTorr.

The etching stop phenomenon was observed during a one-minute etching process at a point indicated by a code 28a on the characteristic curve 28 and at a point indicated by a code 29a on the characteristic curve 29, but the etching stop phenomenon did not take place at any other points on the other characteristic curves.

More specifically, under the condition that the pressure in the reaction chamber 11 was 100 mTorr, when the offset of the resist mask 26, or a placement error, was 0.04 μm, the etching stop phenomenon was observed at a depth of about 250 nm from the upper surface of the electrode member 24.

Under the condition that the pressure in the reaction chamber 11 was 200 mTorr, when an error in placing the resist mask 26 was 0.05 μm, the etching stop phenomenon occurred at a depth of about 150 nm from the upper surface of the electrode member 24.

From the tendency shown in the graph (1) of FIG. 3, as the pressure of the reaction chamber 11 is increased, the placement error at which the etching stop phenomenon occurs is considered to increase. Therefore, it is understood that the depth d (in nm) of the unaligned portion of the etched hole 27 from the upper surface of the electrode member 24 does not exceed 200 nm when the pressure of the reaction chamber 11 is maintained at 100 mTorr or higher so long as the error in placing the resist mask 26 is not more than 0.04 μm.

Referring back to FIG. 1(c), a distance H from the upper surface of the electrode member 24 to the lower electrode member 25 is generally larger than 300 nm.

Therefore, if the permissible placement error of the resist mask 26 is limited to 0.4μm and the resist mask 26 is placed properly within this error limit, by performing the etching process to the insulating layer 23 under the condition that the reaction chamber pressure is maintained at 100 mTorr or higher while supplying the reaction chamber 11 of the reactive ion etching unit 10 with a mixed reaction gas of $CHF_3$ and CO at a flow ratio of about 15/85 for these component gases, as shown in FIG. 1(c), the unaligned portion due to the offset of the etched hole 27 never reaches the lower electrode member 25 even if there is an offset within the permissible error.

Therefore, when the placement error of the resist mask 26 is not more than 0.04 μm, without stuffing up the unaligned portion due to the offset of the etched hole 27 by an insulating material as in the prior art, the conductive path 32a, which extends from the upper surface 23a of the insulating layer 23 to the electrode member 24, can be formed relatively easily by merely removing the resist mask 26 and then filling the etched hole 27 including the unaligned portion with a conductive material 32 as shown in FIG. 1(d), with no possibility of a short-circuit occurring in the lower electrode member 25.

According to the above-mentioned method of the present invention, as described above, there is no need to stuff up the unaligned portion of the etched hole 27 caused by an offset of the resist mask 26, and therefore the conductive path 32a that fills up the etched hole 27 is not reduced in diameter and an increase in electrical resistance, which would otherwise arise, can be prevented.

Figure 4:
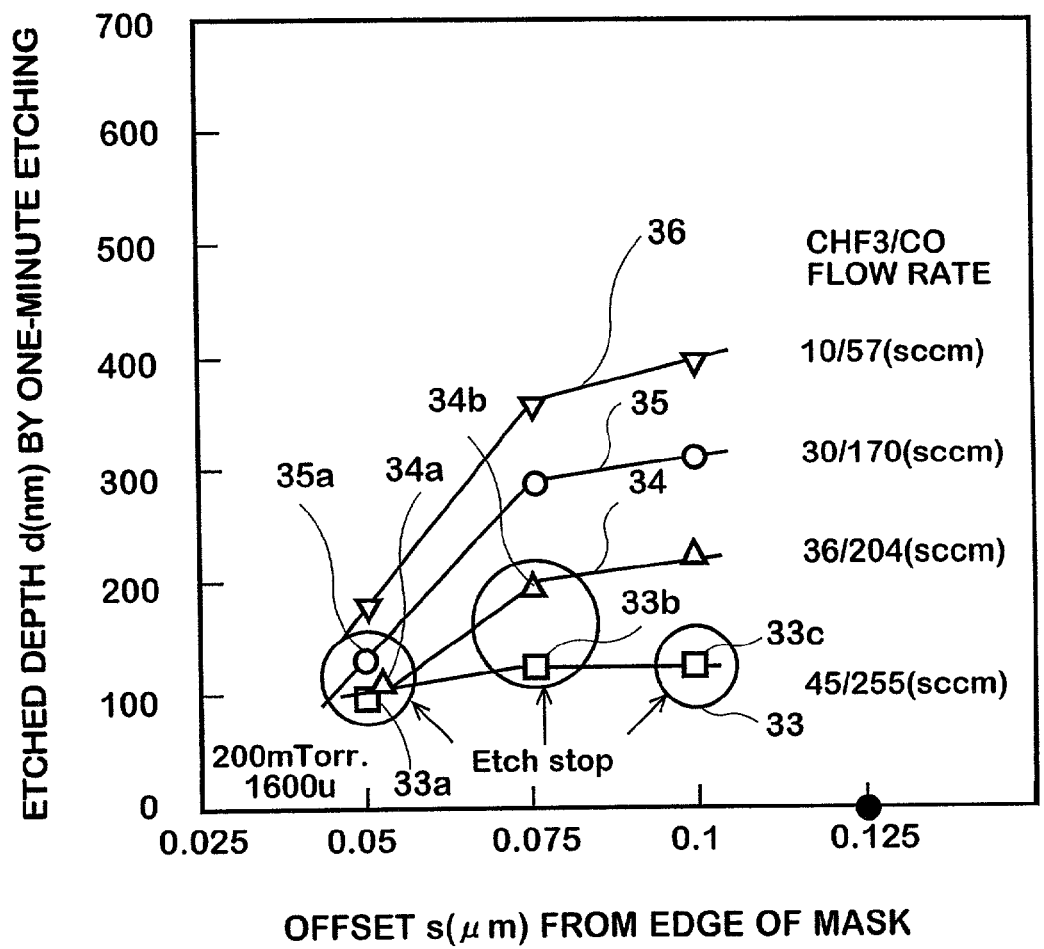
FIG. 4 is a graph (2) showing the etching characteristics of the insulating layer when the reaction chamber pressure was varied by mixed-gas fixed flow rates in the reactive ion etching unit according to the present invention.

FIG. 4 is a graph (2) obtained from results of an experiment to find the etching stop condition, in which, as in the graph (1) of FIG. 3, the horizontal axis denotes offsets s (in μm) of the resist mask 26 and the vertical axis denotes depths d (in nm) (see FIG. 1(c)) of the unaligned portion of the etched hole 27 from the upper surface of the electrode member 24 by etching for one minute.

In the experiment to obtain the graph (2) in FIG. 4, the relation the depth d after one-minute etching and the offset of the resist mask 26 when the mixed gas was supplied to the reaction chamber 11 at flow rates of $CHF_3$/CO of 10/57 sccm, 30/170 sccm, 36/204 sccm and 45/255 sccm so that the $CHF_3$/CO flow ratio of about 15/85 under the condition that the pressure of the reaction chamber 11 was maintained at 200 mTorr and output of the high-frequency power source 21 was maintained at 1600 W.

The characteristic curves 33, 34 and 35 in the graph (2) of FIG. 4 show the relation between the depth d and the offset of the resist mask 26 at flow rates of $CHF_3$/CO of 45/255 sccm, 36/204 sccm, 30/170 sccm and 10/57 sccm.

The etching stop phenomenon was observed in a one-minute etching process respectively at points indicated by codes 33a, 33b and 33c on the characteristic curve 33, at points indicated by codes 34a and 34b on the characteristic curve 34, and at a point indicated by a code 35a on the characteristic curve 35, but the etching stop phenomenon was not observed at any other points on the other characteristic curve.

As is clear from the graph (2) of FIG. 4, it is understood that the etching stop phenomenon is observed at a depth of about 100 nm from the upper surface of the electrode member 24 under the condition that the pressure of the reaction chamber 11 is 200 mTorr when the flow rates of $CHF_3/CO$ of not less than 300 sccm, such as 45/255 sccm if the offset of the resist mask 26 is not more than 0.1 μm.

Therefore, by setting the pressure of the reaction chamber 11 in the reactive ion etching unit at 200 mTorr or higher and the flow rate of the reactive gas at about 300 sccm or higher, a short-circuit can be prevented more securely and a larger permissible placement error can be assigned to the etching mask.

In the foregoing, description has been made of an example in which the lower electrode member was disposed below the electrode member embedded in the insulating layer made of silicon dioxide; however, the present invention is not limited to this example, but can be effectively applied to a case where under the condition that a conductive part of a semiconductor substrate or some other conductive part is placed below the electrode member in the some other conductive part is placed below the electrode member in the insulating layer including silicon dioxide, a short-circuit to such a conductive part as mentioned above is to be prevented and a conductive path is to be securely formed to extend to the above-mentioned electrode member without causing an increase in electrical resistance.

Instead of the above-mentioned dipole rink magnetron reactive ion etching unit, various types of reactive ion etching units can be used.

According to a method for manufacturing a semiconductor device of the present invention, as described above, by utilizing the etching stop phenomenon, it is possible to prevent an unnecessary extension of the etched hole caused by misalignment of the etching mask, which is responsible for the short-circuit problem, and therefore an appropriate conductive path can be formed without stuffing the unaligned portion of the etched hole resulting from the misalignment by an insulating material as in the prior art.

Consequently, it is possible to preclude various defects, which used to occur in the prior caused by stuffing the unaligned recess portion of the etched hole by an insulating material. For this reason, it becomes possible to produce a semiconductor device that can prevent an increase in electrical resistance of the conductive path that fills up the through-hole without increasing complexity of the manufacturing process or incurring the short-circuit problem.

What is claimed is:

1. A method of forming a conductive path in a semiconductor device, comprising:
    forming an insulating layer on a semiconductor substrate, the insulating layer having a first conductive member and a second conductive member embedded therein spaced apart from each other, so that the second conductive member is below the first conductive member, and so that the first and second conductive members are covered by the insulating layer;
    forming an etching mask on the insulating layer, the etching mask having an opening over the first conductive member;
    etching the insulating layer using the etching mask in a reaction chamber, wherein a reaction chamber pressure is not less than about 100 mTorr, a reaction gas consists of $CHF_3$ and CO, a flow ratio of $CHF_3$ and CO is about 15/85, and a flow rate of the reaction gas is not less than about 300 sccm, so that the insulating layer under the opening of the etching mask is removed and an etch stop occurs in the insulating layer between the first and second conductive members without exposing the second conductive member; and
    filling a removed portion of the insulating layer with a conductive material to form the conductive path.

2. A method of forming a conductive path according to claim 1, wherein the reaction chamber pressure is about 200 mTorr.

3. A method of forming a conductive path according to 1, wherein the semiconductor substrate is biased by a high-frequency power source.

4. A method of forming a conductive path according to claim 3, wherein the high-frequency power source is maintained at about 1600 W.

5. A method of forming a conductive path according to claim 1, wherein the insulating layer is made of silicon oxide.

6. A method of forming a conductive path according to claim 1, wherein the flow rate of $CHF_3/CO$ is about 45/255 sccm.

7. A method of forming a conductive path according to claim 1, wherein the opening in the etching mask is formed as misaligned laterally with respect to the first conductive member by less than 0.1 μm.

8. A method of forming a conductive path according to claim 1, wherein the reaction chamber pressure is 200 mTorr, the flow ratio of $CHF_3$ and CO is 15/85, the flow rate of the reaction gas is 300 sccm, and the opening in the etching mask is formed as misaligned laterally with respect to the first conductive member by less than 0.1 μm 9. A method of forming a conductive path according to claim 8, wherein a distance between an upper surface of the first conductive member to the second conductive member is greater than 300 nm, and a hole formed during said etching has a depth from the upper surface of the first conductive member to a bottom of the hole that does not exceed 200 nm.

10. A method of forming a conductive path in a semiconductor device, comprising:
    providing a semiconductor structure including a semiconductor substrate, an insulating layer formed on the semiconductor substrate, and first and second conductive members formed in the insulating layer spaced apart from each other, so that the second conductive member is below the first conductive member;
    forming an etching mask on the insulating layer, the etching mask having an opening over the first conductive member;
    etching the insulating layer using the etching mask in a reaction chamber, wherein a reaction chamber pressure is not less than about 100 mTorr, a reaction gas consists of $CHF_3$ and CO, a flow ratio of $CHF_3$ and CO is about 15/85, and a flow rate of the reaction gas is not less than about 300 sccm, so that the insulating layer under the opening of the etching mask is removed to expose the first conductive member and an etch stop occurs in the insulating layer between the first and second conductive members without exposing the second conductive member; and
    filling a removed portion of the insulating layer with a conductive material to form the conductive path.

11. A method of forming a conductive path according to 10, wherein the reaction chamber pressure is about 200 mTorr.

12. A method of forming a conductive path according to 10, wherein the semiconductor substrate is biased by a high-frequency power source.

13. A method of forming a conductive path according to 12, wherein the high-frequency power source is maintained at about 1600 W.

14. A method of forming a conductive path according to 10, wherein the insulating layer is made of silicon oxide.

15. A method of forming a conductive path according to 10, wherein the flow rate of $CHF_3$/CO is about 45/255 sccm.

16. A method of forming a conductive path according to claim 10, wherein the opening in the etching mask is formed as misaligned laterally with respect to the first conductive member by less than 0.1 μm.

17. A method of forming a conductive path according to claim 10, wherein the reaction chamber pressure is 200 mTorr, the flow ratio of $CHF_3$ and CO is 15/85, the flow rate of the reaction gas is 300 sccm, and the opening in the etching mask is formed as misaligned laterally with respect to the first conductive member by less than 0.1 μm.

18. A method of forming a conductive path according to claim 17, wherein a distance between an upper surface of the first conductive member to the second conductive member is greater than 300 nm, and a hole formed during said etching has a depth from the upper surface of the first conductive member to a bottom of the hole that does not exceed 200 nm.

* * * * *